US008537519B2

(12) United States Patent
Besse et al.

(10) Patent No.: US 8,537,519 B2
(45) Date of Patent: Sep. 17, 2013

(54) SEMICONDUCTOR DEVICE AND METHOD OF ELECTROSTATIC DISCHARGE PROTECTION THEREFOR

(75) Inventors: Patrice Besse, Toulouse (FR); Stephanie Creveau-Boury, Toulouse (FR); Alexis Huot-Marchand, Labarthe sur Leze (FR)

(73) Assignee: Freescale Semiconductor, Inc., Austin, TX (US)

( * ) Notice: Subject to any disclaimer, the term of this patent is extended or adjusted under 35 U.S.C. 154(b) by 135 days.

(21) Appl. No.: 12/995,325

(22) PCT Filed: Jun. 20, 2008

(86) PCT No.: PCT/IB2008/053502
§ 371 (c)(1),
(2), (4) Date: Nov. 30, 2010

(87) PCT Pub. No.: WO2009/153627
PCT Pub. Date: Dec. 23, 2009

(65) Prior Publication Data
US 2011/0084339 A1    Apr. 14, 2011

(51) Int. Cl.
*H02H 9/00*   (2006.01)
(52) U.S. Cl.
USPC .......................................... 361/118
(58) Field of Classification Search
USPC .......................................... 361/118
See application file for complete search history.

(56) References Cited

U.S. PATENT DOCUMENTS

| 3,748,547 | A | 7/1973 | Sugimoto | |
|---|---|---|---|---|
| 5,079,608 | A * | 1/1992 | Wodarczyk et al. | 257/355 |
| 5,172,290 | A | 12/1992 | Leipold et al. | |
| 5,581,131 | A | 12/1996 | Urushiwara et al. | |
| 7,170,135 | B2 * | 1/2007 | Zecri et al. | 257/355 |
| 7,916,439 | B2 * | 3/2011 | Zecri et al. | 361/56 |
| 8,022,505 | B2 * | 9/2011 | Renaud et al. | 257/577 |
| 2006/0043490 | A1 | 3/2006 | Brauchler et al. | |
| 2007/0096213 | A1 | 5/2007 | Tsai et al. | |

FOREIGN PATENT DOCUMENTS

| DE | 2131167 A1 | 2/1972 |
|---|---|---|
| DE | 3920805 A1 | 1/1991 |
| JP | 2002026714 A | 1/2002 |

OTHER PUBLICATIONS

International Search Report and Written Opinion correlating to PCT/IB2008/053502 dated Feb. 18, 2009.

* cited by examiner

*Primary Examiner* — Stephen W Jackson

(57) ABSTRACT

A semiconductor device comprises at least one switching element. The at least one switching element comprises a first channel terminal, a second channel terminal and a switching terminal, the switching element being arranged such that an impedance of the switching element between the first and second channel terminals is dependant upon a voltage across the switching terminal and the first channel terminal. The semiconductor device further comprises a resistance element operably coupled between the first channel terminal of the at least one switching element and a reference node, and a clamping structure operably coupled between the switching terminal of the switching element and the reference node. The resistance element and the clamping structure are arranged such that, when current flowing through the at least one switching element, between the first and second channel terminals, exceeds a threshold current value, a voltage drop across the resistance element exceeds a difference between (i) a clamping voltage of the clamping structure and (ii) a switching voltage threshold of the at least one switching element, causing the impedance between the first and second channel terminals of the at least one switching component to increase.

20 Claims, 3 Drawing Sheets

US 8,537,519 B2

SEMICONDUCTOR DEVICE AND METHOD OF ELECTROSTATIC DISCHARGE PROTECTION THEREFOR

FIELD OF THE INVENTION

The field of this invention relates to a semiconductor device, and more particularly to a semiconductor device comprising at least one switching element.

BACKGROUND OF THE INVENTION

In the field of this invention, it is known for electronic devices and the like to require protection from high current stress, such as generated by ESD (ElectroStatic Discharge) events. Typically, sensitive circuits are provided with ESD protection components or circuitry whereby, in the event of an ESD event, the ESD protection components divert ESD current to, for example, a ground plane and away from the sensitive circuitry. However, there is typically a slight delay between the occurrence of an ESD event and the ESD protection components reacting, and diverting the ESD current away from the sensitive circuitry. During this delay, the sensitive circuitry is problematically exposed to a large current. Although the sensitive circuitry may only be exposed to the large current for a short period of time, it may be sufficient to damage some or all of the sensitive circuitry.

Switching elements, such as transistors, may be particularly prone to such large currents if such currents cause the switching elements to be switched to an 'on' state such that the currents are allowed to flow through them. In such a case, the excessive currents that flow through the switching elements before the ESD protection circuitry has time to react and divert the ESD currents away from the sensitive circuitry may destroy the switching elements. As a result, traditional ESD protection components are not sufficient for providing adequate protection to some sensitive circuits in which switching elements, such as transistors, are used and particularly may be susceptible to ESD currents.

A known method for preventing transistors and the like from switching to an 'on' state is to provide an ESD detection circuit which is separate from the traditional ESD protection circuitry, and arranged to detect an ESD event by, for example, detecting a high dV/dt event using, say, an RC time-constant and capacitive coupling. The ESD detection circuitry is arranged, upon detection of an ESD event, to hold the transistor in a deactivated state, for example using a switch or the like. A problem with the use of such an ESD detection circuit is that, not only does it require the RC time constant to be optimised for particular ESD events, but also, in the case of inductive loads being switched by the transistor, the ESD detection circuit can be triggered during normal operation and may lead to circuit oscillations.

SUMMARY OF THE INVENTION

The present invention provides a semiconductor device as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. Elements in the figures are illustrated for simplicity and clarity and have not necessarily been drawn to scale.

DETAILED DESCRIPTION OF EMBODIMENTS OF THE INVENTION

Embodiments of the invention will now be described with reference to switching elements in a form of Metal Oxide Semiconductor Field Effect Transistors (MOSFETs). However, it is envisaged that the invention is not limited to MOSFETs, but rather may be implemented with respected to other forms of switching elements, such as bipolar transistors, Insulated Gate Bipolar Transistors (IGBTs), Semiconductor-Controlled Rectifiers (SCRs), etc. For example, in the case of a bipolar transistor, references to first and second channel terminals used herein, such as source and drain terminals of a MOSFET, may be considered synonymous with, and thus encompassing, collector and base terminals of bipolar transistors. Similarly, references to switching terminals, such as gate terminals of a MOSFET, may be considered synonymous with, and thus encompassing, base terminals of bipolar transistors.

Figure 1:
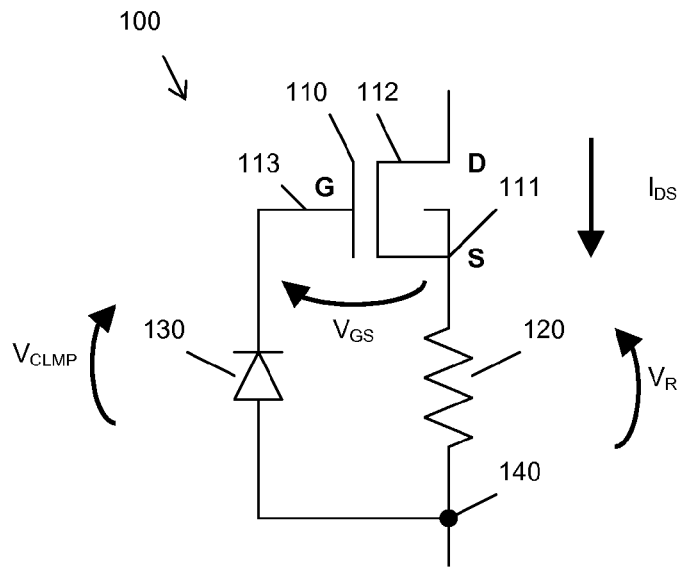
FIG. 1 illustrates an example of a switching element according to some embodiments of the invention.

Referring now to FIG. 1, there is illustrated an example of a switching element adapted according to some embodiments of the invention. For the illustrated embodiment, the switching element is in a form of an N-channel MOSFET 110. The switching element comprises a first channel terminal, which for the illustrated embodiment comprises a source terminal 111 of the MOSFET 110, a second channel terminal, which for the illustrated embodiment comprises a drain terminal 112 of the MOSFET 110, and a switching terminal, which for the illustrated embodiment comprises a gate terminal 113 of the MOSFET 110. As is known in the art, switching elements such as MOSFET 110 are arranged such that an impedance of the switching element between the first and second channel terminals is arranged to be dependent upon a voltage across the switching terminal and the first channel terminal. In particular, for an N-channel MOSFET, such as the MOSFET 110 illustrated in FIG. 1, when a voltage ($V_{GS}$) across the gate terminal 113 and the source terminal 111 falls below a switching voltage threshold ($V_{TH}$), the impedance of the MOSFET 110 between the source and drain terminals is caused to increase.

A resistance element 120 is operably coupled between the source terminal 111 of the MOSFET 110 and a reference node 140. A clamping structure 130 is operably coupled between the gate terminal 113 of the MOSFET 110 and the reference node 140. For the illustrated embodiment, the clamping structure 130 is in a form of a diode, such as a zener diode, which may be arranged to substantially clamp a voltage drop across itself to a clamping voltage ($V_{CLMP}$). As will be appreciated, embodiments of the invention are not limited to the use of a single (zener) diode in order to provide the clamping structure 130, but may comprise any suitable alternative structure for providing a clamping voltage between the switching terminal and the first channel terminal of the switching element. For example, it is envisaged that the clamping structure may comprise a plurality of diodes, coupled in series with one another. An alternative example may comprise a transistor and a diode: for example a MOSFET transistor with a diode operably coupled between the gate and drain terminals thereof. A yet further alternative example is envisaged as comprising a bipolar transistor with a diode operably coupled between the base and collector terminals therefor.

The resistance element 120 and the clamping structure 130 are arranged such that, when a current ($I_{DS}$) flowing through the MOSFET 110, between the drain and source terminals 112, 111, exceeds a threshold current value ($I_{TH}$), a voltage drop ($V_R$) across the resistance element 120 exceeds a difference between:
(i) the clamping voltage ($V_{CLMP}$) of the clamping structure 130 and
(ii) the switching voltage threshold ($V_{TH}$) of the MOSFET 110.

This causes the impedance between the source and drain terminals 111, 112 of the MOSFET 110 to increase. In this manner, the increase in the impedance between the source and drain terminals 111, 112 of the MOSFET 110 limits the current ($I_{DS}$) flowing there through, thus protecting the MOSFET 110 from damage caused by excessive current flow.

More specifically for the exemplary embodiment illustrated in FIG. 1, the voltage drop ($V_R$) across the resistance element 120 is substantially equal to the clamping voltage ($V_{CLMP}$) across the clamping structure 130 less the voltage ($V_{GS}$) across the gate terminal 113 and the source terminal 111 of the MOSFET 110. Thus, the voltage ($V_R$) across the resistive element 120 may be expressed as follows:

$$V_R = V_{CLMP} - V_{GS} \quad \text{[Equation 1]}$$

The voltage drop ($V_R$) across the resistance element 120 is dependant on the current flowing there through, and thus may be expressed as follows:

$$V_R = I_{DS} * R \quad \text{[Equation 2]}$$

where $I_{DS}$ is the current flowing through the MOSFET 110, and R is the resistance of resistance element 120. Accordingly, the current flowing through the MOSFET 110 may be expressed in terms of R, $V_{CLMP}$ and $V_{GS}$ as follows:

$$I_{DS} = (V_{CLMP} - V_{GS})/R \quad \text{[Equation 3]}$$

As previously mentioned, switching elements, such as N-channel MOSFET 110, are arranged such that, when the voltage ($V_{GS}$) falls below a switching voltage threshold ($V_{TH}$), an impedance of the MOSFET 110 between the source and drain terminals 111, 112 is caused to increase. Thus, for the illustrated embodiment, the threshold current value ($I_{TH}$), above which the current flowing through the MOSFET 110 causes the impedance of the MOSFET 110 to increase, may be expressed as follows:

$$I_{TH} = (V_{CLMP} - V_{TH})/R \quad \text{[Equation 4]}$$

As will be appreciated, the greater the current flowing through the MOSFET 110 between the drain and source terminals 112, 111, the greater the voltage drop ($V_R$) across the resistance element 120, and thus the higher the voltage at the source terminal 111 of the MOSFET 110. As a result, since the voltage at the gate terminal 113 of the MOSFET 110 is substantially clamped by the clamping structure 130, the current flowing through the MOSFET 110 has a substantially direct effect on the voltage ($V_{GS}$) across the gate and source terminals 113, 111 thereof. Thus, the resistance element 120 and the clamping structure 130, in this arrangement, provide a means by which the MOSFET 110 is able to self limit the current flowing there through when the current ($I_{DS}$) exceeds the threshold current value ($I_{TH}$). In this manner, the MOSFET 110 is able to protect itself from potentially damaging currents caused by, for example, ESD events and the like.

Figure 2:
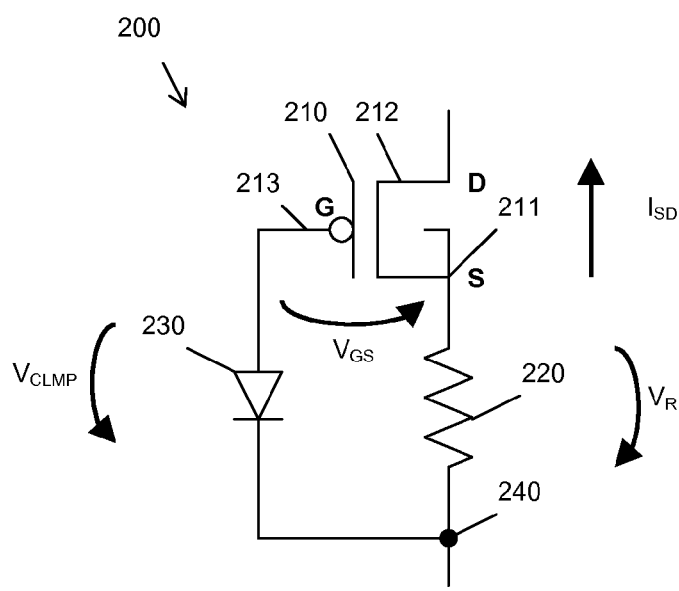
FIG. 2 illustrates an example of a switching element according to some alternative embodiments of the invention.

Referring now to FIG. 2, there is illustrated an example of a switching element according to some alternative embodiments of the invention. In particular, FIG. 2 illustrates a switching element in the form of a P-channel MOSFET 210. The P-channel MOSFET 210 comprises a first channel terminal in a form of a source terminal 211, a second channel terminal in a form of a drain terminal 212, and a switching terminal in a form of a gate terminal 213. As is known in the art, for a P-channel MOSFET, such as the MOSFET 210 illustrated in FIG. 2, when a voltage ($V_{GS}$) across the gate terminal 213 and the source terminal 211 exceeds a switching voltage threshold ($V_{TH}$), the impedance of the MOSFET 210 between the source and drain terminals is caused to increase.

A resistance element 220 is operably coupled between the source terminal 211 of the MOSFET 210 and a reference node 240. A clamping structure 230 is operably coupled between the gate terminal 213 of the MOSFET 210 and the reference node 240. The resistance element 220 and the clamping structure 230 are arranged such that, when current ($I_{SD}$) flowing through the MOSFET 210, between the source and drain terminals 211, 212, exceeds a threshold current value ($I_{TH}$), a voltage drop ($V_R$) across the resistance element 220 exceeds a difference between:
(i) the clamping voltage ($V_{CLMP}$) of the clamping structure 230, and
(ii) the switching voltage threshold ($V_{TH}$) of the MOSFET 210.

This causes the impedance between the source and drain terminals 211, 212 of the MOSFET 210 to increase.

More specifically for the exemplary embodiment illustrated in FIG. 2, the voltage drop ($V_R$) across the resistance element 220 is substantially equal to the clamping voltage ($V_{CLMP}$) across the clamping structure 230 less the voltage ($V_{GS}$) across the gate terminal 213 and the source terminal 211 of the MOSFET 210. Thus, in the same way as for the embodiment illustrated in FIG. 1, the voltage drop ($V_R$) across the resistive element 220 may be expressed using Equation 1 above.

The voltage drop ($V_R$) across the resistance element 220 is dependant on the current flowing there through, and thus may be expressed as follows:

$$V_R = I_{SD} * R \quad \text{[Equation 5]}$$

Where: $I_{SD}$ is the current flowing through the MOSFET 210, and R is the resistance of resistance element 220. Accordingly, the current flowing through the MOSFET 210 may be expressed in terms of R, $V_{CLMP}$ and $V_{GS}$ as follows:

$$I_{SD} = (V_{CLMP} - V_{GS})/R \quad \text{[Equation 6]}$$

As previously mentioned, switching elements, such as P-channel MOSFET 210, are arranged such that, when the voltage ($V_{GS}$) exceeds a switching voltage threshold ($V_{TH}$), an impedance of the MOSFET 210 between the source and drain terminals 211, 212 is caused to increase. Thus, for the illustrated embodiment, the threshold current value ($I_{TH}$) above which the current flowing through the MOSFET 210 causes the impedance of the MOSFET 210 to increase, may also be expressed Equation 4.

In the same way as for the exemplary embodiment illustrated in FIG. 1, the greater the current flowing through the MOSFET 210 between the source and drain terminals 211, 212, the greater the voltage drop ($V_R$) across the resistance element 220, and thus the lower the voltage at the source terminal 211 of the MOSFET 210. As a result, since the voltage at the gate terminal 213 of the MOSFET 210 is substantially clamped by the clamping structure 230, the current flowing through the MOSFET 210 has a substantially direct effect on the voltage ($V_{GS}$) across the gate and source terminals 213, 211 thereof. Thus, the resistance element 220 and the clamping structure 230 provide a means by which the MOSFET 210 is able to self limit the current flowing there through when the current ($I_{SD}$) exceeds the threshold current value ($I_{TH}$). In this manner, the MOSFET 210 is able to protect itself from potentially damaging currents caused by, for example, ESD events and the like.

Figure 3:
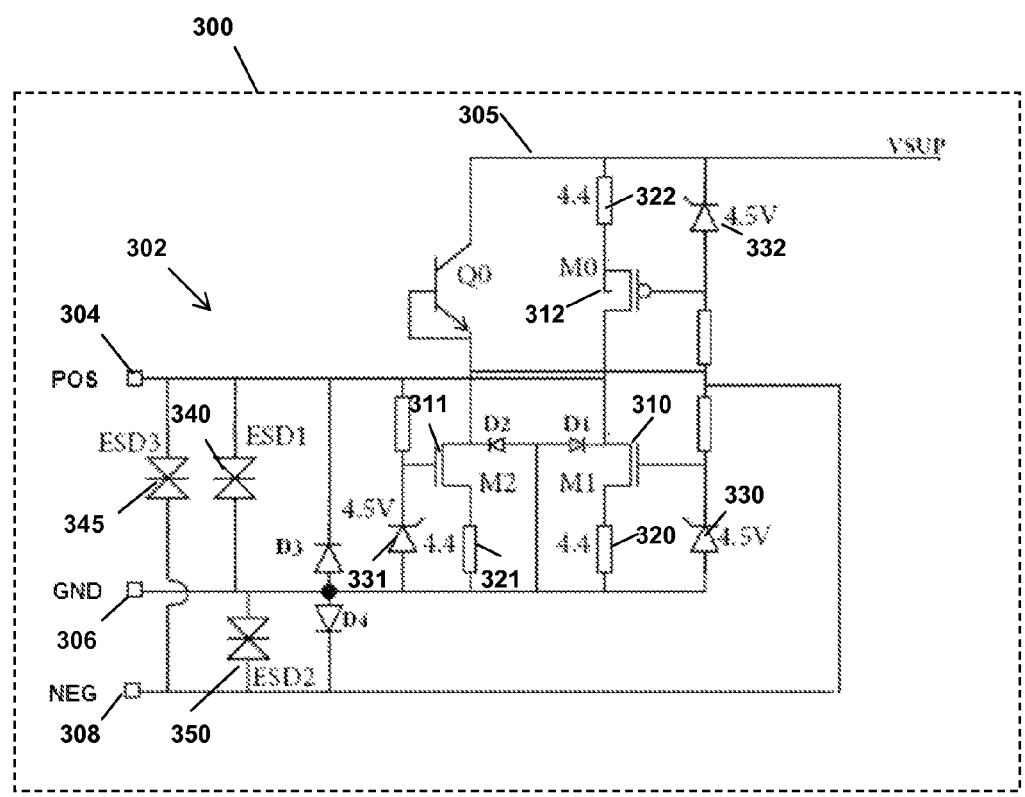
FIG. 3 illustrates an example of part of a semiconductor device according to some embodiments of the invention.

Referring now to FIG. 3, there is illustrated an example of part of a semiconductor device 300 according to some embodiments of the invention. The semiconductor device comprises circuitry 302 in a form of a plurality of switching elements that are sensitive to high current stress, such as caused by ESD events and the like. In particular, the semiconductor device 300 comprises switching elements 310, 311, 312. The semiconductor device further comprises ESD protection components 340, 345, 350, operably coupled between POS (positive), GND (ground) and NEG (negative) pins 304, 306, 308 of the semiconductor device 300, and arranged to divert high stress currents away from the sensitive circuitry 302, for example caused by an ESD event.

As previously mentioned, there is typically a slight delay between the occurrence of an ESD event and ESD protection components reacting, and diverting the ESD current away from the sensitive circuitry. During this delay, the sensitive circuitry may be exposed to a large, potentially damaging, current. Although the sensitive circuitry may only be exposed to the large current for a short period of time, it may be sufficient to damage some or all of the sensitive circuitry.

Accordingly, for each of the switching elements 310, 311, 312, the semiconductor device 300 further comprises a resistance element 320, 321, 322 operably coupled between a first channel terminal of the respective switching element 310, 311, 312 and a reference node, and a clamping structure 330, 331, 332 operably coupled between a switching terminal of the respective switching element and the reference node. For switching element 312, the reference node comprises a voltage supply rail (VSUP) 305, whilst for switching elements 310, 311, the reference node comprises the GND pin 306.

In the event of an ESD event occurring on, for example, the POS pin 304, for each of switching elements 310, 311, which are in a form of N-channel MOSFETs, such as the MOSFET of FIG. 1, a transient current from the ESD event occurring inside the parasitic drain to gate capacitance of the MOSFET 310, 311, causes the voltage ($V_{GS}$) across the gate and source terminals of the respective MOSFET 310, 311 to increase. If the ESD event is sufficiently large, the voltage ($V_{GS}$) across the gate and source terminals of the respective MOSFET 310, 311 will exceed the switching voltage threshold ($V_{TH}$) for the respective MOSFET 310, 311, and as such the MOSFET 310, 311 switches 'on', thereby allowing current to flow there through.

As previously mentioned, if a large enough current is allowed to pass through the MOSFET 310, 311, it may damage or destroy the MOSFET. However, the resistance elements 320, 321 operably coupled to the source terminal of each MOSFET 310, 311 cause the voltage at the source terminal to increase as the current flowing through the MOSFET 310, 311 increases, whilst the clamping structure 330, 331 operably coupled to the gate terminal of each MOSFET 310, 311, effectively clamps the voltage at the gate terminal. As a result, the current flowing through the MOSFET 310, 311 has a substantially direct effect on the voltage ($V_{GS}$) across the gate and source terminals thereof. Thus, the resistance elements 320, 321 and the clamping structure 330, 331 provide a means by which the MOSFET 310, 310 is able to self limit the current flowing there through when the current exceeds the threshold current value ($I_{TH}$) as described above.

By way of example, for the embodiment illustrated in FIG. 3, each clamping structure is arranged to clamp the voltage at the gate terminal of its respective switching element to approximately 4.5V, whilst each resistance element is arranged to comprise a resistance of approximately 4.4 ohms. Thus, taking Equation 4 above, and assuming each MOSFET 310, 312 comprises a switching voltage threshold ($V_{TH}$) of approximately 1.2V, the threshold current value ($I_{TH}$) above which the current flowing through the MOSFET 110 causes the impedance of the MOSFET 110 to increase, may be expressed as follows:

$$I_{TH}=(4.5V-1.2V)/4.4\ \text{ohms}=0.75\ \text{Amps} \qquad [\text{Equation 7}]$$

Thus, when the current passing through the MOSFET 310, 311 reaches 0.75 amps, the impedance of the MOSFET 310, 311 is caused to increase, thereby limiting the current flowing there through. In this manner, the maximum current that can flow through the MOSFET 310, 311 is substantially limited to 0.75 Amps.

Similarly, for the switching element 312, which is in a form of a P-channel MOSFET, such as the MOSFET 210 illustrated in FIG. 2, the respective resistance element 322 and clamping structure 332 are arranged to limit the current flowing there through in a similar manner.

In this manner, the ability of the switching elements 310, 311, 312 to self-limit the current flowing through themselves enables the switching elements 310, 311, 312 to protect themselves during, for example, an ESD event or the like, prior to the ESD protection components 340, 345, 350 reacting to divert high currents away from the sensitive circuitry. Furthermore, the ability of the switching elements 310, 311, 312 to self-limit current flowing through themselves, and thus to protect themselves from high current stress is not dependent on specific optimisation from particular ESD events. Also, embodiments of the invention allow for protection of the switching element against transient events and electromagnetic disturbances that can provide a current peak with or during the activation of the switching element.

Figure 4:
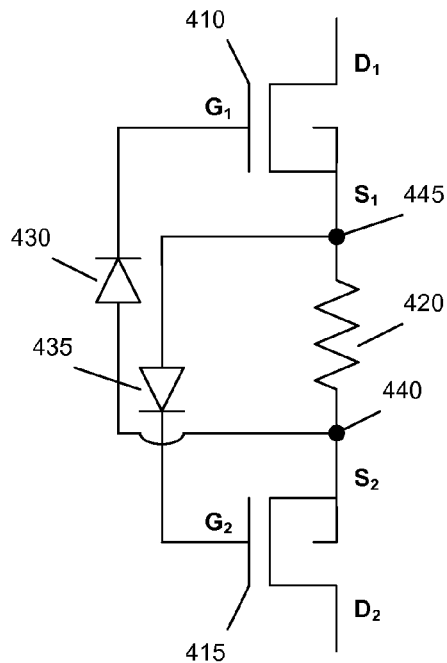
FIG. 4 illustrates an example of dual switching elements according to some embodiments of the invention.

Referring now to FIG. 4, there is illustrated an example of dual switching elements adapted according to some alternative embodiments of the invention. The dual switching elements comprise a pair of N-channel MOSFETs 410, 415, each comprising a first channel terminal in a form of a source terminal 411, 416 respectively, a second channel terminal in a form of a drain terminal 412, 417 respectively, and a switching terminal in a form of a gate terminal 413, 418 respectively.

A resistance element 420 is operably coupled between the source terminals 411, 416 of the MOSFETs 410, 415. A first clamping structure 430 is operably coupled between the gate terminal 413 of the first MOSFET 410 and the source terminal 416 of the second MOSFET 415. A second clamping structure 435 is operably coupled between the gate terminal 418 of the second MOSFET 415 and the source terminal 411 of the first MOSFET 410.

In this manner, each MOSFET is configured in a similar manner to the MOSFET 110 of FIG. 1, with the source terminal of the first MOSFET 410 providing a reference node 445 for the second MOSFET 115, and the source terminal of the second MOSFET 415 providing a reference node 440 for the first MOSFET 110.

Thus, the resistance element 420 and the first and second clamping structures 430, 435 are arranged such that, when current flowing through the respective MOSFETs, between the drain and source terminals thereof, exceeds a threshold current value for the respective MOSFET, a voltage drop across the resistance element 420 exceeds a difference between:
(i) a clamping voltage of the respective clamping structure, and
(ii) a switching voltage threshold of the respective switching element, This causes the impedance between the first and second channel terminals of the respective switching element to increase.

Figure 5:
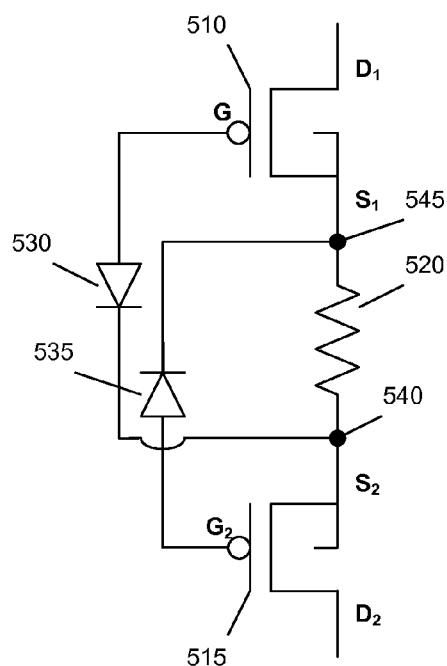
FIG. 5 illustrates an example of dual switching elements according to some alternative embodiments of the invention.

Referring now to FIG. 5, there is illustrated a further example of dual switching elements adapted according to some further alternative embodiments of the invention. For the example illustrated in FIG. 5, the switching elements comprise a pair of P-channel MOSFETs 510, 515, each comprising a first channel terminal in a form of a source terminal 511, 516 respectively, a second channel terminal in a form of a drain terminal 512, 517 respectively, and a switching terminal in a form of a gate terminal 513, 518 respectively. A resistance element 520 is operably coupled between the source terminals 511, 516 of the MOSFETs 510, 515. A first clamping structure 530 is operably coupled between the gate terminal 513 of the first MOSFET 510 and the source terminal 516 of the second MOSFET 515. A second clamping structure 535 is operably coupled between the gate terminal 518 of the second MOSFET 515 and the source terminal 511 of the first MOSFET 510. In this manner, each MOSFET is configured in a similar manner to the MOSFET 210 of FIG. 2, with the source terminal of the first MOSFET 510 providing a reference node 545 for the second MOSFET 515, and the source terminal of the second MOSFET 515 providing a reference node 540 for the first MOSFET 510.

In the foregoing specification, the invention has been described with reference to specific examples of embodiments of the invention. It will, however, be evident that various modifications and changes may be made therein without departing from the broader spirit and scope of the invention as set forth in the appended claims. For example, the connections may be any type of connection suitable to transfer signals from or to the respective nodes, units or devices, for example via intermediate devices. Accordingly, unless implied or stated otherwise the connections may for example be direct connections or indirect connections.

The semiconductor substrate described herein can be any semiconductor material or combinations of materials, such as gallium arsenide, silicon germanium, silicon-on-insulator (SOI), silicon, monocrystalline silicon, the like, and combinations of the above.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Moreover, the terms 'front,' 'back,' 'top,' 'bottom,' 'over,' 'under' and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Thus, it is to be understood that the architectures depicted herein are merely exemplary, and that in fact many other architectures can be implemented which achieve the same functionality. In an abstract, but still definite sense, any arrangement of components to achieve the same functionality is effectively 'associated' such that the desired functionality is achieved. Hence, any two components herein combined to achieve a particular functionality can be seen as 'associated with' each other such that the desired functionality is achieved, irrespective of architectures or intermedial components. Likewise, any two components so associated can also be viewed as being 'operably connected,' or 'operably coupled,' to each other to achieve the desired functionality.

As will be appreciated by a skilled artisan, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, Furthermore, the terms 'a' or 'an,' as used herein, are defined as one or more than one. Also, the use of introductory phrases such as 'at least one' and 'one or more' in the claims should not be construed to imply that the introduction of another claim element by the indefinite articles 'a' or 'an' limits any particular claim containing such introduced claim element to inventions containing only one such element, even when the same claim includes the introductory phrases 'one or more' or 'at least one' and indefinite articles such as 'a' or 'an.' The same holds true for the use of definite articles. Unless stated otherwise, terms such as 'first' and 'second' are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. A semiconductor device comprising:
   a first switching element, the first switching element comprising a first channel terminal, a second channel terminal and a switching terminal, the first switching element being arranged such that an impedance of the first switching element between the first channel terminal and the second channel terminal is dependant upon a voltage across the first switching terminal and the first channel terminal;
   a second switching element, the second switching element comprising a first channel terminal, a second channel terminal and a switching terminal, second switching element being arranged such that an impedance of the second switching element between the first channel terminal and second channel terminal is dependant upon a voltage across the second switching terminal and the first channel terminal;
   a resistance element operably coupled between the first channel terminal of the first switching element and the first channel terminal of the second switching element;
   a first voltage clamping structure operably coupled between the switching terminal of the first switching element and the first channel terminal of the second switching element;
   a second voltage clam structure operably coupled between the switching terminal of the second switching element and the first channel terminal of the first switching element; and electrostatic discharge (ESD) protection circuitry arranged in parallel with the voltage clamping structure;

wherein the resistance element and the first and second voltage clamping structures are arranged such that, when current flowing through the first and second switching elements, between the first channel terminal and the second channel terminal of each of the first and second switching elements, exceeds a threshold current value, a voltage drop across the resistance element exceeds a difference between (i) a clamping voltage of the voltage clamping structure and (ii) a switching voltage threshold of at least one switching element, such that the impedance between the first and second channel terminals of at least one switching component increases and the ESD protection circuitry diverts current away from the at least one switching element.

2. The semiconductor device of claim 1 wherein the at least one switching element comprises a transistor.

3. The semiconductor device of claim 2 wherein the at least one switching element comprises a Field Effect Transistor (FET), wherein the first channel terminal comprises a source terminal of the transistor and the switching terminal comprises a gate terminal of the transistor.

4. The semiconductor device of claim 3 wherein the at least one switching element comprises a Metal Oxide Semiconductor Field Effect Transistor (MOSFET).

5. The semiconductor device of claim 2 wherein the at least one switching element comprises a bipolar junction transistor.

6. The semiconductor device of claim 2 wherein the at least one switching element comprises an Insulated Gate Bipolar Transistor (IGBT).

7. The semiconductor device of claim 1 wherein the at least one switching element comprises a Semiconductor-Controlled Rectifier (SCR).

8. The semiconductor device of claim 1 wherein the voltage clamping structure comprises a diode.

9. The semiconductor device of claim 8 wherein the diode limits the voltage drop across itself to a maximum value in a region of 4.0 to 5.0 volts.

10. The semiconductor device of claim 1 where the resistance element comprise a resistance of value in a region of 4.0 to 5.0 ohms.

11. A method for electrostatic discharge (ESD) protection in a semiconductor device that comprises a resistance element, a voltage clamping structure, electrostatic discharge (ESD) protection circuitry arranged in parallel with the voltage clamping structure, a first switching element having a first channel terminal, a second channel terminal, and a switching terminal, and a second switching element having a first channel terminal, a second channel terminal and a switching terminal the method comprising:

configuring the first switching element such that an impedance of the first switching element between the first channel terminal and the second channel terminal is dependant upon a voltage across the switching terminal and the first channel terminal;

configuring the second switching element such that an impedance of the second switching element between the first channel terminal and the second channel terminal is dependant upon a voltage across the switching terminal and the first channel terminal;

configuring the resistance element and the voltage clamping structure such that, when current flowing through the at least one switching element, between the first channel terminal and second channel terminal, exceeds a threshold current value, a voltage drop across the resistance element exceeds a difference between (i) a clamping voltage of the voltage clamping structure and (ii) a switching voltage threshold of at least one switching element, wherein the resistance element is operably coupled between the first channel terminal of the first switching element and the first channel terminal of the second switching element, and the voltage clamping structure is operably coupled between the switching terminal of the first switching element and the first char terminal of the second switching element; and diverting current away from the at least one switching element by the ESD protection circuitry.

12. The semiconductor device of claim 2 wherein the voltage clamping structure comprises a diode.

13. The semiconductor device of claim 3 wherein the voltage clamping structure comprises a diode.

14. The semiconductor device of claim 4 wherein the voltage clamping structure comprises a diode.

15. The semiconductor device of claim 5 wherein the voltage clamping structure comprises a diode.

16. The semiconductor device of claim 2 where the resistance element comprise a resistance of value in a region of 4.0 to 5.0 ohms.

17. The semiconductor device of claim 3 where the resistance element comprise a resistance of value in a region of 4.0 to 5.0 ohms.

18. A semiconductor device comprising:

a first switching element including a first channel terminal, a second channel terminal and a switching terminal;

a second switching element including a first channel terminal, a second channel terminal and a switching terminal respectively;

a resistance element operably coupled between the first channel terminal of the first switching element and the first channel terminal of the second switching element;

a first voltage clamping structure operably coupled between the switching terminal of the first switching element and the first channel terminal of the second switching element; and a second voltage clamping structure operably coupled between the switching terminal of the second switching element and the first channel terminal of the first switching element, wherein the resistance element and the first and second voltage clamping structures are arranged such that, when current flowing through respective switching element, between the first and second channel terminals thereof, exceeds a threshold current value for that switching element, a voltage drop across the resistance element exceeds a difference between (i) a clamping voltage of the respective voltage clamping structure and (ii) a switching voltage threshold of the respective switching element, thereby causing the impedance between the first and second channel terminals of the respective switching element to increase.

19. The semiconductor device of claim 18 further comprising:

electrostatic discharge protection circuitry operably coupled between the second switching terminal of the first switching element and the second switching terminal of the second switching element.

20. The semiconductor device of claim 18 wherein the first voltage clamping structure comprises a diode.

* * * * *